(12) United States Patent
Vilangudipitchai et al.

(10) Patent No.: US 12,323,142 B2
(45) Date of Patent: Jun. 3, 2025

(54) INTEGRATED POWER MANAGEMENT CELLS FOR GATE ALL AROUND TECHNOLOGIES

(71) Applicant: QUALCOMM Incorporated, San Diego, CA (US)

(72) Inventors: Ramaprasath Vilangudipitchai, San Diego, CA (US); Venkat Narayanan, San Diego, CA (US); Giby Samson, San Diego, CA (US); Venugopal Boynapalli, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 79 days.

(21) Appl. No.: 18/504,062

(22) Filed: Nov. 7, 2023

(65) Prior Publication Data
US 2025/0150080 A1 May 8, 2025

(51) Int. Cl.
*H03K 3/012* (2006.01)
*H03K 3/356* (2006.01)
*H03K 19/0185* (2006.01)

(52) U.S. Cl.
CPC ..... *H03K 19/018521* (2013.01); *H03K 3/012* (2013.01); *H03K 3/356113* (2013.01)

(58) Field of Classification Search
None
See application file for complete search history.

(56) References Cited

U.S. PATENT DOCUMENTS

| 11,710,733 | B2 * | 7/2023 | Lim | H01L 23/5286 |
| | | | | 257/401 |
| 2017/0194949 | A1 | 7/2017 | Srivastava et al. | |
| 2022/0115405 | A1 * | 4/2022 | Lim | H10D 84/907 |
| 2022/0271742 | A1 | 8/2022 | Park et al. | |

OTHER PUBLICATIONS

International Search Report and Written Opinion—PCT/US2024/052827—ISA/EPO—Feb. 12, 2025.

* cited by examiner

*Primary Examiner* — Jeffrey S Zweizig
(74) *Attorney, Agent, or Firm* — Procopio, Cory, Hargreaves & Savitch LLP

(57) ABSTRACT

At least one integrated power management cell of an IC includes a first cell, which is a 4-height cell, that includes a first continuous n-well, a first power interconnect coupled to a first voltage source associated with a first voltage domain and to the first continuous n-well, a second continuous n-well, a second power interconnect coupled to a second voltage source associated with a second voltage domain and to the second continuous n-well, a first subset of a first voltage level shifter associated with the first voltage domain and coupled to the first power interconnect, and a second subset of the first voltage level shifter associated with the second voltage domain and coupled to the second power interconnect.

19 Claims, 11 Drawing Sheets

GAAFET

FinFET

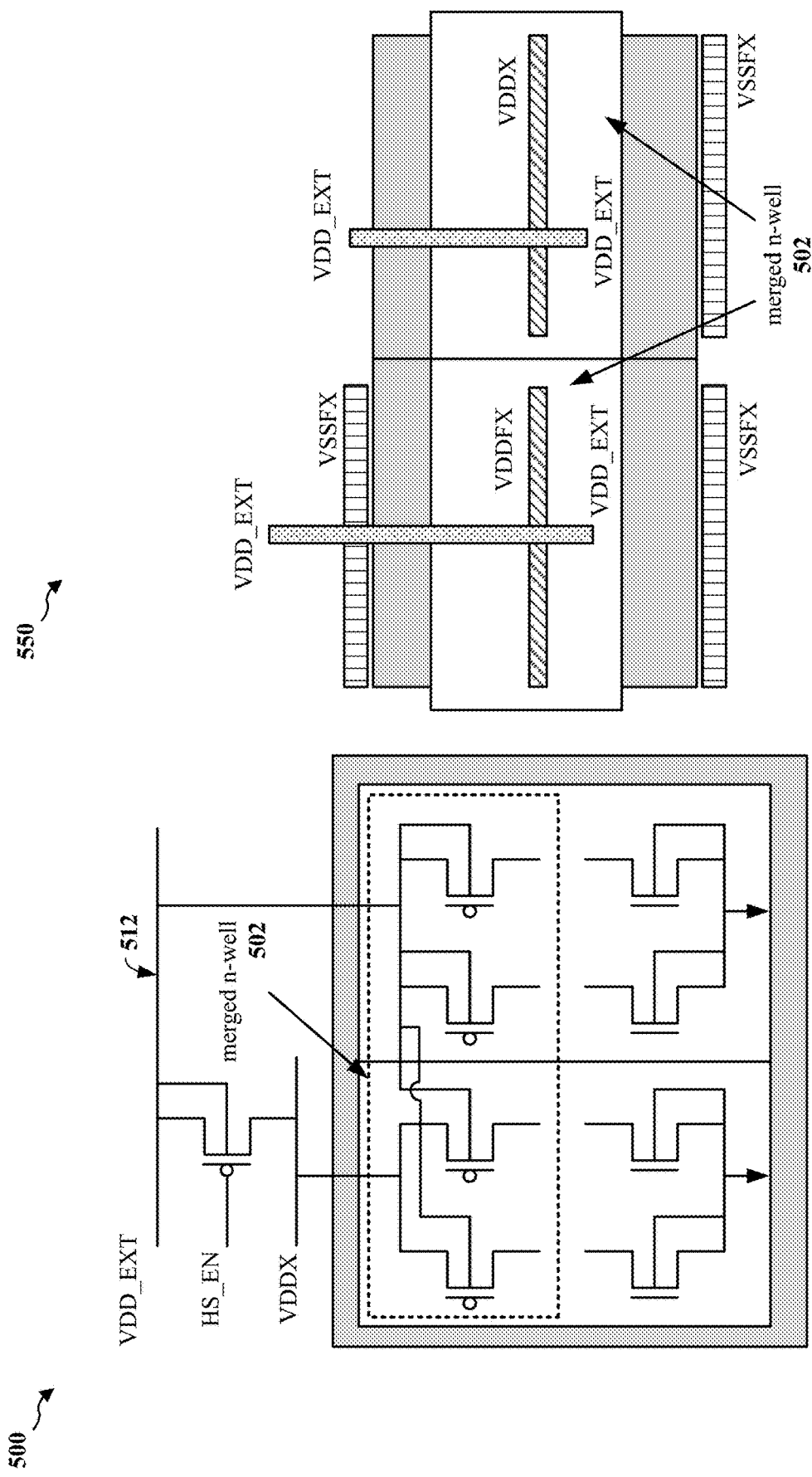

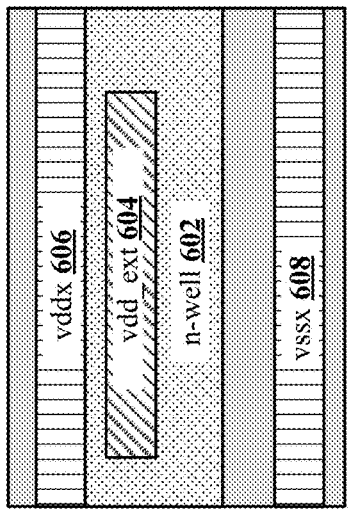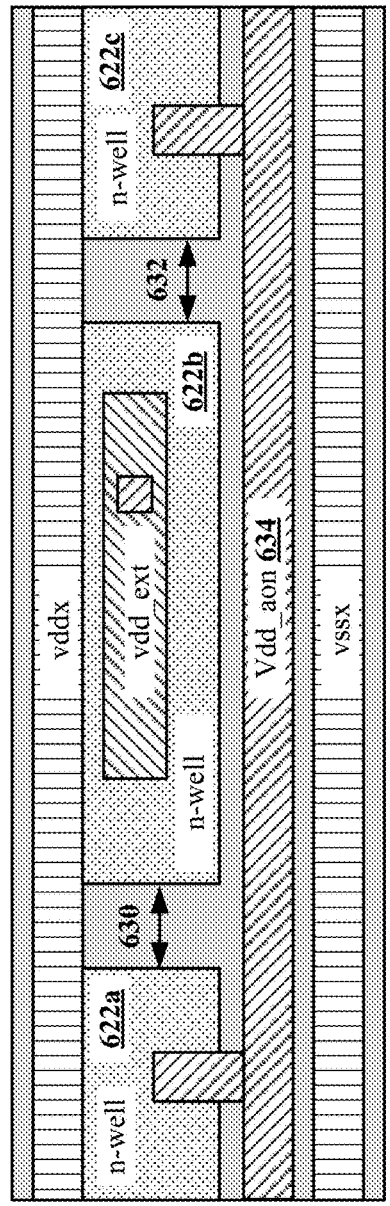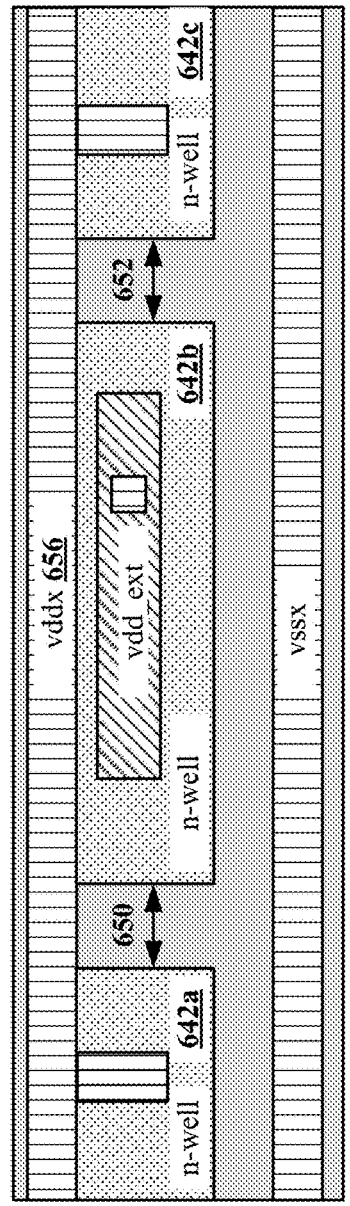
FIG. 6A
FIG. 6B
FIG. 6C

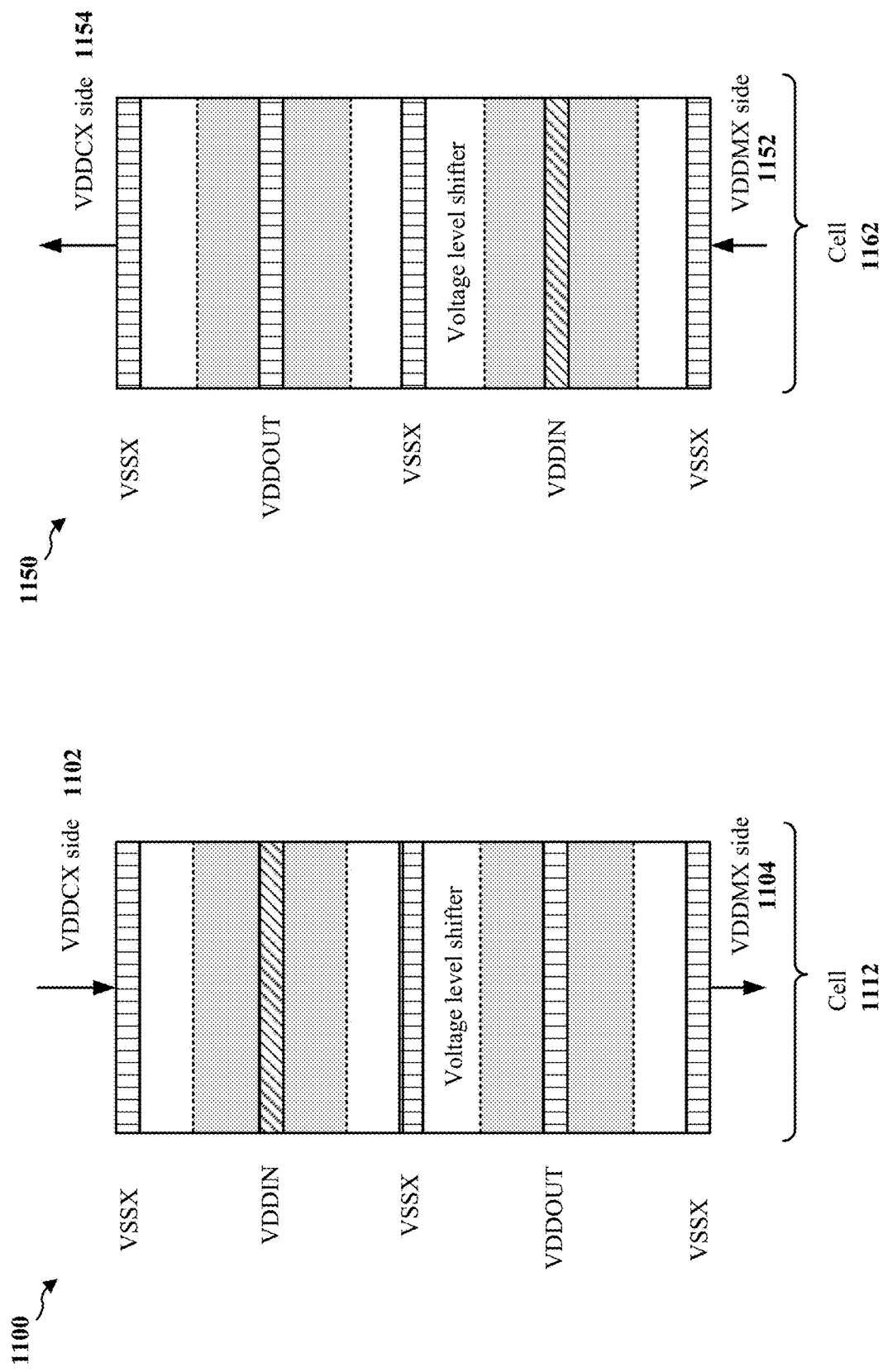

INTEGRATED POWER MANAGEMENT CELLS FOR GATE ALL AROUND TECHNOLOGIES

TECHNICAL FIELD

The present disclosure relates generally to a layout structure of the integrated circuit (IC) and, more particularly, to integrated power management cells for gate all around (GAA) technologies.

INTRODUCTION

Gate all around (GAA) technologies is a transistor design where the gate materials surround the conducting channel from all sides. GAA technologies provide a better effective transistor width ($W_{eff}$) and superior electrostatics control over other types of transistors, such as field effect transistors (FETs) and/or fin FETs (FinFETs), in which the gate materials only partially surround the conducting channel.

However, GAA technologies have undesired parasitic bottom transistors (PBT) under the bottom nanosheet channel, increasing junction leakage. When n-type wells (n-wells) are merged in GAA technologies, the junction leakage escalates, deteriorating the transistor performance. Although separating the n-wells may reduce the junction leakage, it results in a larger footprint area per transistor. Therefore, there is a need to address the junction leakage issues without significantly increasing the footprint area of GAA transistors.

BRIEF SUMMARY

In an aspect of the disclosure, at least one integrated power management cell of an integrated circuit (IC) includes a first cell. The first cell is a 4-height cell that includes a first row, a second row, a third row, and a fourth row. The first cell further includes a first continuous n-type well (n-well), a first power interconnect, a second continuous n-well, a second power interconnect, and a first voltage level shifter that includes a first subset and a second subset. The first continuous n-well extends in a first direction across portions of the first row and the second row of the first cell to edges of the first cell. The first power interconnect extends in the first direction along the edges of both the first row and the second row of the first cell and coupled to a first voltage source associated with a first voltage domain and to the first continuous n-well. The second continuous n-well extends in the first direction across portions of the third row and the fourth row of the first cell to edges of the first cell. The second power interconnect extends in the first direction along the edges of both the third row and the fourth row of the first cell and coupled to a second voltage source associated with a second voltage domain and to the second continuous n-well. The first subset of a first voltage level shifter is in one of the first row or the second row of the first cell, and the first subset of the first voltage level shifter is associated with the first voltage domain and coupled to the first power interconnect. The second subset of the first voltage level shifter is in one of the third row or the fourth row of the first cell, and the second subset of the first voltage level shifter is associated with the second voltage domain and coupled to the second power interconnect.

BRIEF DESCRIPTION OF THE DRAWINGS

FIG. 5A is a diagram illustrating the schematic view of an example of a merged n-well.

FIG. 5B is a diagram illustrating the layout view of an example of a merged n-well.

FIG. 6A is a diagram illustrating an example of a cell with a merged n-well.

FIG. 6B is a diagram illustrating an example of cells with split n-wells.

FIG. 6C is a diagram illustrating another example of cells with split n-wells.

FIG. 11A is a diagram illustrating an example of an integrated power management cell in accordance with various aspects of the present disclosure.

FIG. 11B is a diagram illustrating an example of an integrated power management cell in accordance with various aspects of the present disclosure.

DETAILED DESCRIPTION

Figure 1:
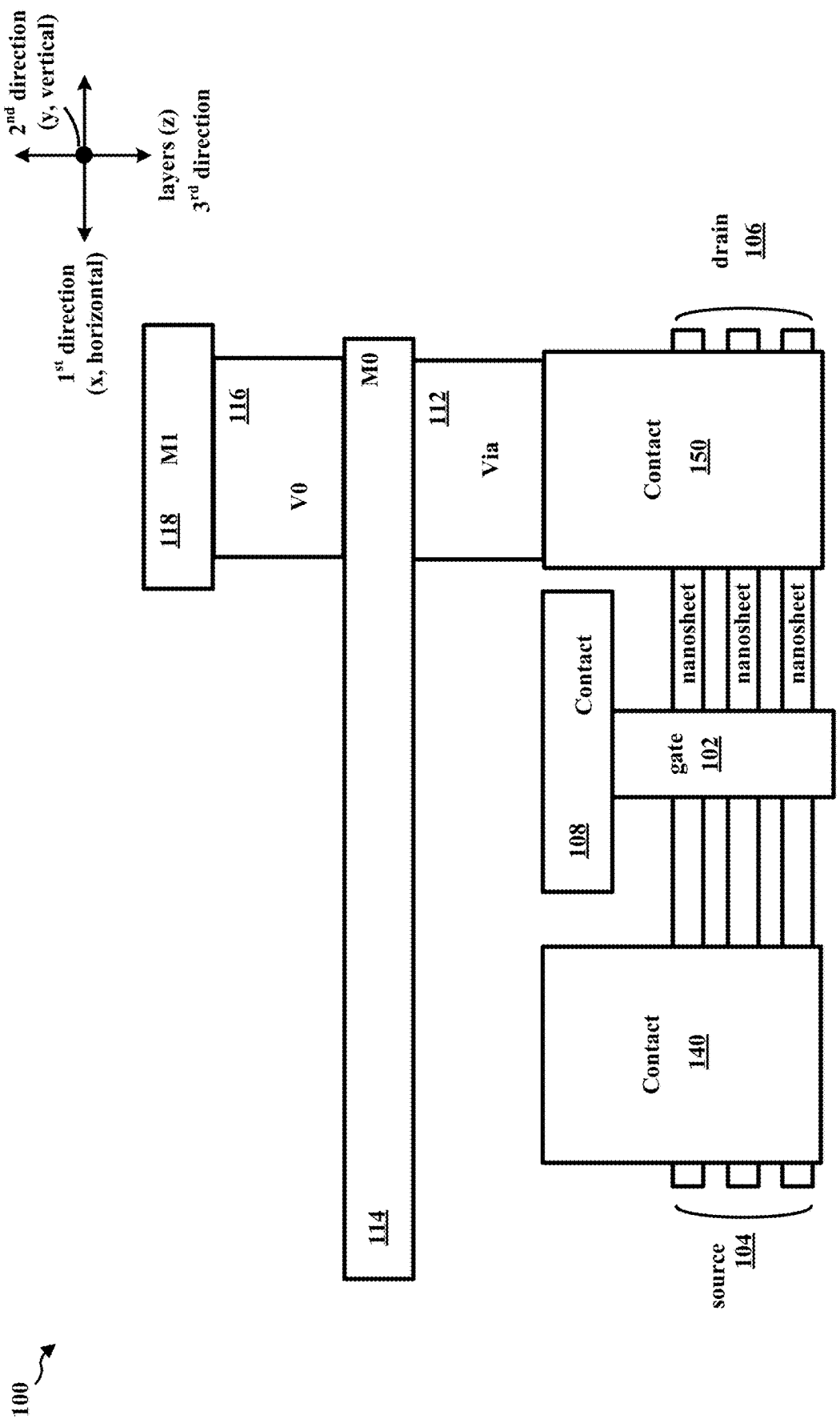
FIG. 1 is a first diagram illustrating a side view of various layers within an integrated circuit (IC).

Gate all around (GAA) technologies have undesired parasitic bottom transistors (PBT) under the bottom nanosheet channel, leading to increased junction leakage. When n-type wells (n-wells) are merged in GAA technologies, the junction leakage escalates, deteriorating the transistor performance. Although separating the n-wells may reduce the junction leakage, it results in a larger footprint area per transistor. Example aspects presented herein provide a set of integrated power management cells for GAA technologies, allowing for continuous n-wells without a substantial increase in leakage current.

Various aspects relate generally to the layout structure of the integrated circuit (IC). Some aspects more specifically relate to integrated power management cells for GAA technologies. In some examples, at least one integrated power management cell of an integrated circuit (IC) includes a first cell. The first cell is a 4-height cell that includes a first row, a second row, a third row, and a fourth row. The first cell further includes a first continuous n-type well (n-well), a first power interconnect, a second continuous n-well, a second power interconnect, and a first voltage level shifter that includes a first subset and a second subset. The first continuous n-well extends in a first direction across portions of the first row and the second row of the first cell to edges of the first cell. The first power interconnect extends in the first direction along the edges of both the first row and the second row of the first cell and is coupled to a first voltage source associated with a first voltage domain and to the first continuous n-well. The second continuous n-well extends in the first direction across portions of the third row and the fourth row of the first cell to edges of the first cell. The second power interconnect extends in the first direction along the edges of both the third row and the fourth row of the first cell and is coupled to a second voltage source associated with a second voltage domain and to the second continuous n-well. The first subset of a first voltage level shifter is in one of the first row or the second row of the first cell, and the first subset of the first voltage level shifter is associated with the first voltage domain and coupled to the first power interconnect. The second subset of the first voltage level shifter is in one of the third row or the fourth row of the first cell, and the second subset of the first voltage level shifter is associated with the second voltage domain and coupled to the second power interconnect.

Particular aspects of the subject matter described in this disclosure can be implemented to realize one or more of the following potential advantages. In some examples, by employing the integrated power management cell presented in the example aspects, the area occupied by a GAA transistor may be reduced without significantly increasing its leakage current. As a result, the overall size of an IC may be reduced. Additionally, the proposed integrated power management cells are scalable. They facilitate the incorporation of multiple bits of voltage level shifter without congestion and allow flipped signal transfer, thereby providing greater versatility in designing layout architectures.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

FIG. 1 is a first diagram 100 illustrating a side view of various layers within a cell device and IC. The various layers change in the z direction (labeled as the $3^{rd}$ direction). As illustrated in FIG. 1, a transistor has a gate 102 (which may be referred to as POLY in some instances even though the gate may be formed of metal, polysilicon, or a combination of polysilicon and metal), a source 104, and a drain 106. The source 104 and the drain 106 may be formed by fins (for FinFETs) or one or more nanosheet channels (for GAA field effect transistors (GAAFETs)). In a GAAFET (as illustrated), the gate 102 may extend in a second direction (e.g., vertical direction along the y axis coming out of the page), and the one or more nanosheet channels may extend in a first direction orthogonal to the second direction (e.g., horizontal direction along the x axis), and the gate 102 may surround the one or more nanosheet channels from all sides. In a fin field-effect transistor (FinFET), the gate 102 may extend in the second direction, and the fins may extend in the first direction orthogonal to the second direction (e.g., horizontal direction along the x axis). A contact layer interconnect 108 (also referred to as a metal POLY (MP) layer interconnect, or contact B (CB) layer interconnect) may contact the gate 102. Contact layer interconnects 140 and 150 (each may also be referred to as a metal diffusion (MD) layer interconnect, or contact A (CA) layer interconnect) may contact the source 104 and the drain 106, respectively. A via 112 (also referred to as via A (VA)) may contact the contact layer interconnect 150. A metal 0 ($M_0$) layer interconnect 114 may contact the via 112. The $M_0$ layer interconnect 114 is illustrated as extending unidirectionally in the first direction, but may also extend in the second direction. A via $V_0$ 116 may contact the $M_0$ layer interconnect 114. A metal 1 ($M_1$) layer interconnect 118 may contact the via $V_0$ 116. The $M_1$ layer interconnect 118 is illustrated as extending unidirectionally in the second direction, but may alternatively extend unidirectionally in the first direction. Higher layers include a via layer including vias $V_1$, a metal 2 ($M_2$) layer including $M_2$ layer interconnects, and higher via/metal layers. The $M_2$ layer and higher layer interconnects may extend in the first direction or the second direction. Metal layers at a metal q ($M_q$) layer and above may extend in both the first and second directions. A cell device may be implemented with FinFETs, GAAFETs (as illustrated), or other multi-gate FETs. For a continuous oxide diffusion (OD) region across multiple devices, the fins/nanosheets are continuous (in the first direction) across the multiple devices. For a discontinuous OD region across multiple devices, the fins/nanosheets are separate at a diffusion break (e.g., single/double diffusion break extending in the second direction) between different sets of the multiple devices.

Figure 2:
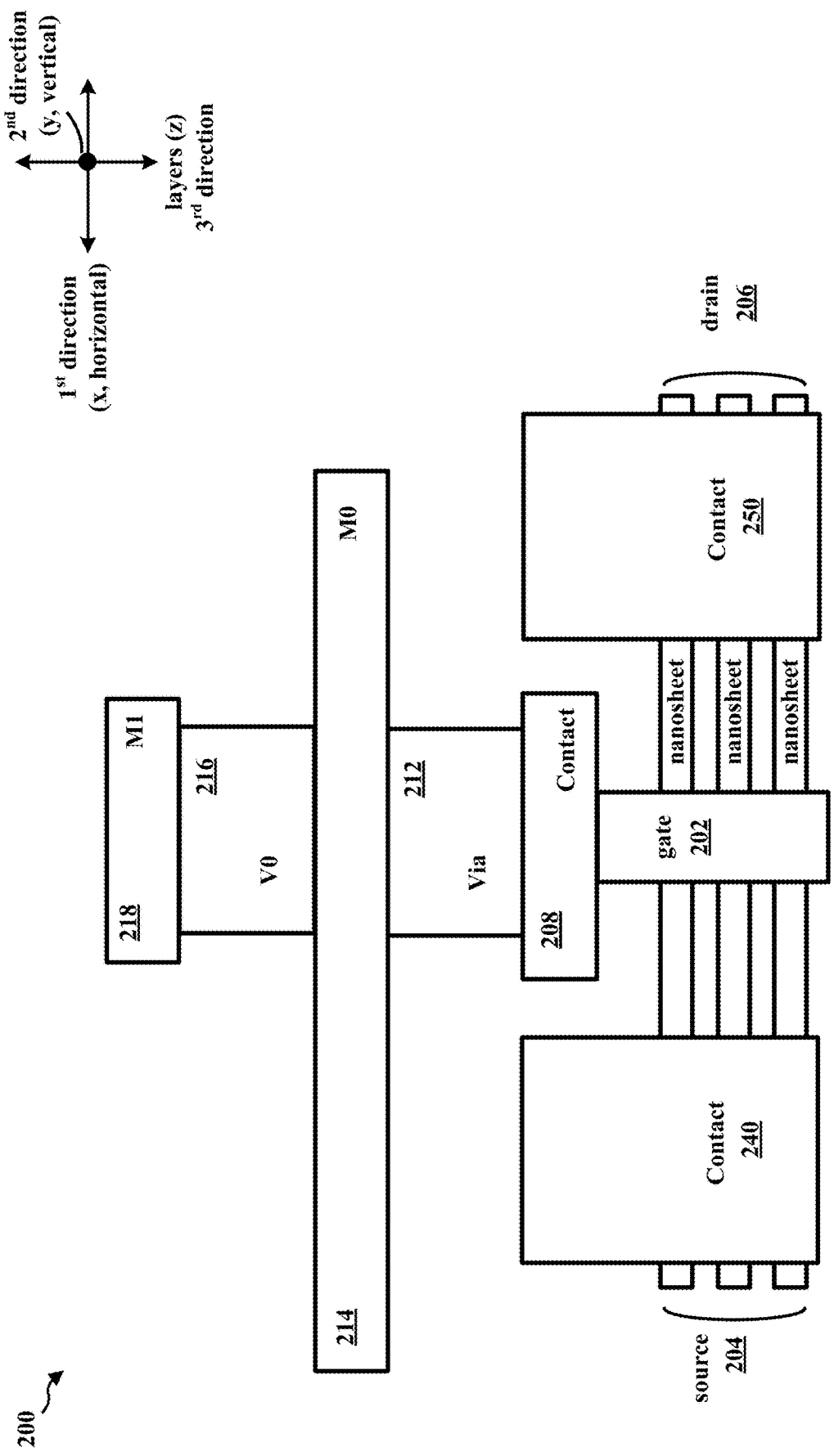
FIG. 2 is a second diagram illustrating a side view of various layers within an IC.

FIG. 2 is a second diagram 200 illustrating a side view of various layers within a standard cell and IC. The various layers change in the z direction (labeled as the $3^{rd}$ direction). As illustrated in FIG. 2, a transistor has a gate 202, a source 204, and a drain 206. The source 204 and the drain 206 may be formed by fins (for FinFETs) or one or more nanosheet channels (for GAAFETs). In a GAAFET (as illustrated), the gate 202 may extend in a second direction (e.g., vertical direction along the y axis coming out of the page), and the one or more nanosheet channels may extend in a first direction orthogonal to the second direction (e.g., horizontal direction along the x axis), and the gate 202 may surround the one or more nanosheet channels from all sides. In a FinFET, the gate 202 may extend in the second direction, and the fins may extend in the first direction orthogonal to the second direction (e.g., horizontal direction along the x axis). A contact layer interconnect 208 (also referred to as MP layer interconnect or CB layer interconnect) may contact the gate 202. Contact layer interconnects 240 and 250 (each may also be referred to as MD layer interconnect or CA layer interconnect) may contact the source 204 and the drain 206, respectively. A via 212 (also referred to as via B (VB)) may contact the contact layer interconnect 208. An $M_0$ layer interconnect 214 may contact the via 212. The $M_0$ layer interconnect 214 is illustrated as extending unidirectionally in the first direction, but may also extend in the second direction. A via $V_0$ 216 may contact the $M_0$ layer interconnect 214. An $M_1$ layer interconnect 218 may contact the via $V_0$ 216. The $M_1$ layer interconnect 218 is illustrated as extending unidirectionally in the second direction, but may alternatively extend unidirectionally in the first direction. Higher layers include a via layer including vias $V_1$, an $M_2$ layer including $M_2$ layer interconnects, and higher via/metal layers. The $M_2$ layer and higher layer interconnects may extend in the first direction or the second direction. Metal layers at an $M_q$ layer and above may extend in both the first and second directions. A cell device may be implemented with FinFETs, GAAFETs (as illustrated), or other multi-gate FETs. For a continuous OD region across multiple devices, the fins/nanosheets are continuous (in the first direction) across the multiple devices. For a discontinuous OD region across multiple devices, the fins/nanosheets are separate at a diffusion break (e.g., single/double diffusion break extending in the second direction) between different sets of the multiple devices.

Referring again to FIGS. 1 and 2, the lowest metal layer is illustrated as being layer 0, but alternatively, the lowest metal layer may be identified as layer 1. The lowest metal layer may extend unidirectionally in the horizontal direction. The layer above the lowest metal layer may extend unidirectionally in the vertical direction. The layer two layers above the lowest metal layer may extend unidirectionally in the horizontal direction.

Example aspects presented herein provide vertically stacked power domains with metal programmable always-on cells integrated as part of voltage level shifter cells between the power domains.

Figure 3B:
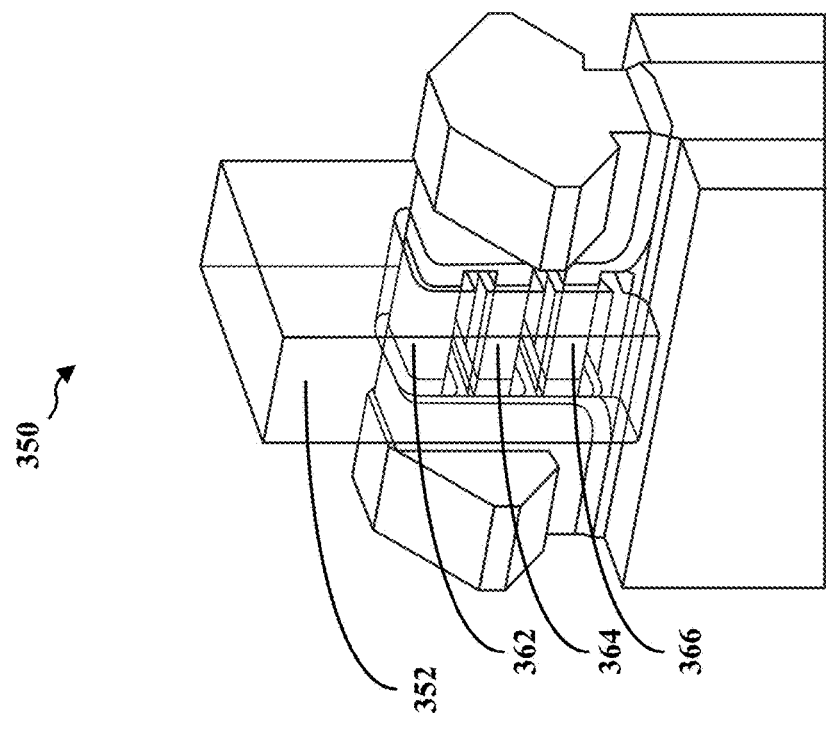
FIG. 3B is a diagram illustrating an example of a gate all around (GAA) field-effect transistor (FET).
Figure 3A:
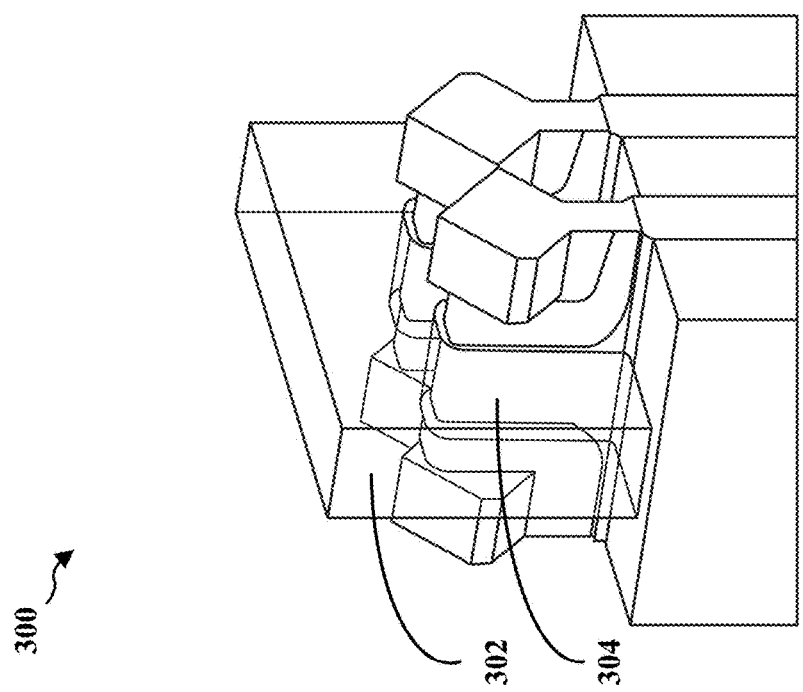
FIG. 3A is a diagram illustrating an example of a fin field-effect transistor (FinFET).

GAA technology is a transistor design where the gate material surrounds the channel region from all sides, enabling better control of the current flow through the channel over other types of transistors, such as planar or field effect transistors (FETs) and/or FinFETs. FIG. 3A is a diagram 300 illustrating an example of a FinFET, where the gate materials 302 surrounds the fin-shaped transistor body 304 from three sides (i.e., except the bottom side). FIG. 3B is a diagram 350 illustrating an example of a GAAFET, where the gate material 352 surrounds multiple nanosheet channels 362, 364, 366 of the GAAFET from all sides. Compared to a FinFET, such as the FinFET of FIG. 3A, GAAFET, such as the GAAFET shown in FIG. 3B, provides a better effective transistor width ($W_{eff}$) and superior electrostatics control.

The cells fabricated with FinFET technologies may have negligible body effect. Hence, FinFETs may have their n-wells merged without significant impact on their performance (e.g., without significantly increasing the junction leakage). As used herein, the "body effect" refers to the change in the threshold voltage due to the source-bulk voltage (or substrate bias). The threshold voltage $V_T$ considering the body effect may be described by the following equation:

$$V_T = V_{T0} + \gamma\left(\sqrt{|-2\phi_F + V_{SB}|} - \sqrt{|2\phi_F|}\right) \quad (1)$$

where $V_{T0}$ is the threshold voltage without body effect, $V_{SB}$ is the source-bulk voltage (or substrate bias), $\phi_F$ is the Fermi potential (negative for nMOS and positive for pMOS), and $\gamma$ is the body effect coefficient.

On the other hand, GAAFETs have undesired parasitic bottom transistors (PBT) under the bottom nanosheet channel (e.g., the nanosheet channel 366 in FIG. 3B), leading to increased junction leakage. When multiple n-wells of GAAFETs are merged, the junction leakage escalates, deteriorating the transistor performance. In some examples, the merged n-wells may increase the junction leakage by approximately two times. To reduce the junction leakage for GAAFETs, the n-wells for the transistors may be split (e.g., separated). However, splitting the n-wells increases the footprint area per transistor.

Figures 4A, 4B:
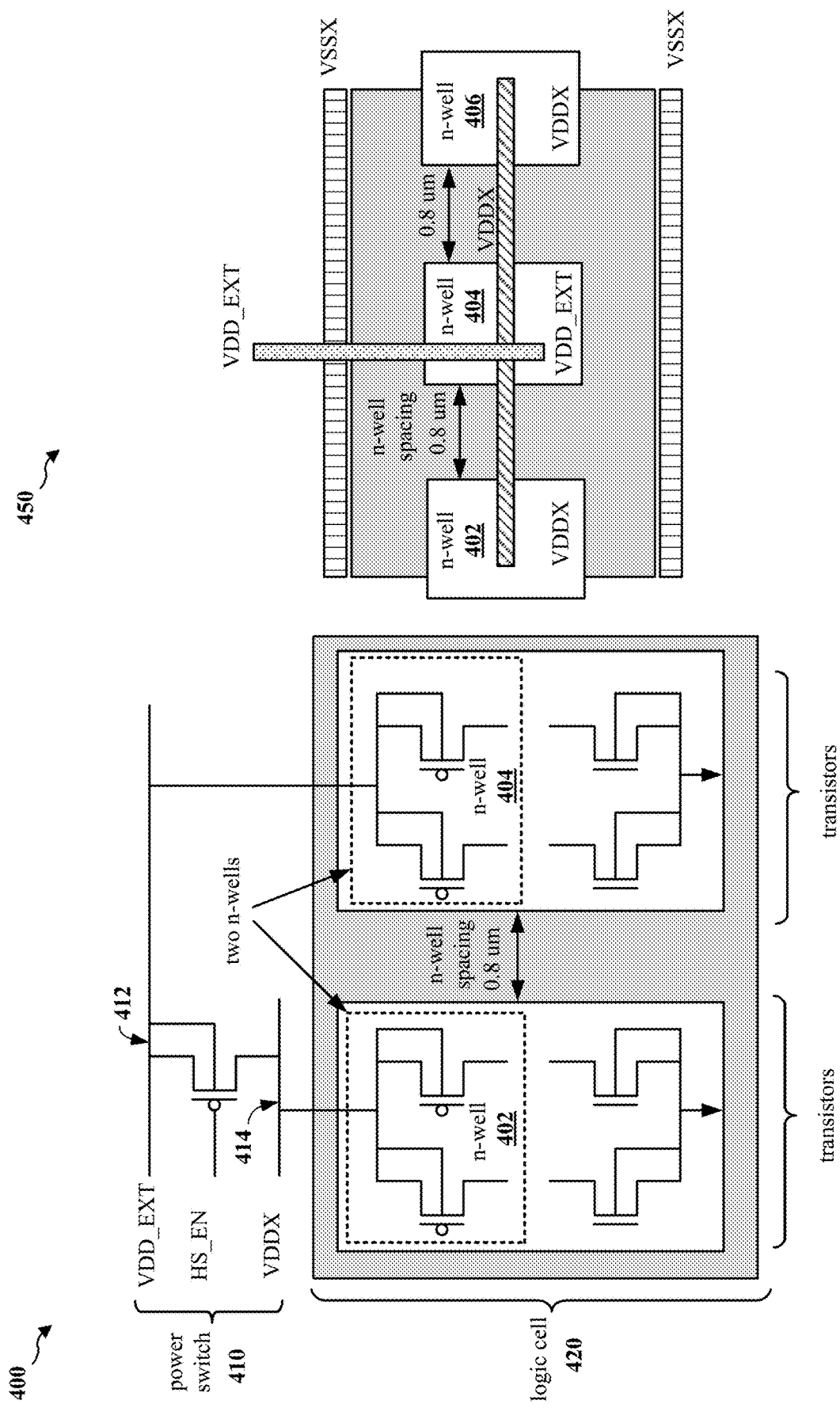
FIG. 4A is a diagram illustrating the schematic view of an example of split n-wells.
FIG. 4B is a diagram illustrating the layout view of an example of split n-wells.

FIGS. 4A and 4B show examples of cells with split n-wells. FIG. 4A is a diagram 400 illustrating the schematic view of an example of two split n-wells. FIG. 4A shows a power switch 410 and an underlying logic cell 420 that is serviced by the power switch 410. The underlying logic cell 420 may include a first set of transistors 422 and a second set of transistors 424. The power switch 410 may include an always-on power supply 412 and a clamp power supply 414. In FIG. 4A, if the transistors are planar transistors, n-well 402 and n-well 404 may be separated (e.g., by the n-well spacing of 0.8 um) to reduce the junction leakage. For example, the first set of transistors 422 may account for the majority portion of the logic cell 420 (compared to the second set of transistors 424). When the power switch 410 is powered off (a clamp power supply 414 is at 0), the first set of transistors 422 may be powered off, and all the logic in the set of transistors 422 may be floating (meaning that the logic can drift to undetermined voltage levels). Hence, the n-well 402 may be connected to the floating supply to reduce the junction leakage, and the n-well 402 may be separated from n-well 404. FIG. 4B is a diagram 450 illustrating the layout view of an example of split n-wells. In FIG. 4B, two separated n-wells (e.g., n-wells 402 and 404) may be separated by the n-well spacing of, for example, 0.8 um. FIG. 4B further shows a third separated n-well 406, positioned 0.8 um (n-well spacing) apart from n-well 404.

FIGS. 5A and 5B show examples of cells with a merged n-well. FIG. 5A is a diagram 500 illustrating the schematic view of an example of a merged n-well. In FIG. 5A, if the transistors are FinFETs, the negligible body effect of the FinFETs allows the FinFETs to be connected with a single always-on power supply 512, and the n-wells for the FinFETs may be merged to form a continuous (i.e., merged) n-well 502, reducing the footprint area occupied by the FinFETs. FIG. 5B is a diagram 550 illustrating the layout view of an example of the merged n-well 502.

GAAFETs may use split n-wells to avoid large junction leakage. However, as shown in FIGS. 4A, 4B, 5A, and 5B, split n-wells increase the footprint area of the transistors compared to a merged n-well due to, for example, the n-well spacing between the split n-wells. In some examples, the split n-wells may increase the footprint area for all power management cells, such as global distributed head switch (GDHS) cells, 0-pin retention flops, and always-on buffers. In some cases, the split n-well may cause a 1.5% to 2% increase in the footprint area compared to that using a merged n-well.

FIG. 6A is a diagram 600 illustrating an example of a merged n-well. In FIG. 6A, a cell may share a merged n-well (e.g., n-well 602) with neighboring cells. The cell sharing the merged n-well may be referred to as the type-1 cell. In FIG. 6A, in addition to the positive power source (e.g., vddx 606) and the ground reference (e.g., vssx 608), the cell with the merged n-well (n-well 602) may have a secondary power (e.g., vdd_ext 604) driving portions of logic but may not have any n-well tap (e.g., a structure connecting the n-well to a voltage source). FIG. 6B is a diagram 620 illustrating an example of a cell with a split n-well. In FIG. 6B, the split n-well (e.g., n-wells 622a, 622b, 622c) of the cell may have built-in taps for the n-wells 622a, 622c. One or more of the build-in taps at 622a, 622c may be connected to a voltage source Vdd_aon 634. This cell may be termed as a type-2 cell. FIG. 6C is a diagram 640 illustrating another example of a cell with a split n-well. In FIG. 6C, the split n-well (e.g., n-wells 642a, 642b, 642c) of the cell may have built-in taps for the n-wells 642a, 642c. One or more of the build-in taps at 642a, 642c may be connected to a voltage source vddx 656. This cell may be termed as a type-3 cell. As shown in FIG. 6B and FIG. 6C, the built-in taps in the split n-wells and the spacing between the split n-wells (e.g., spacings 630, 632, 650, 652) may increase the footprint area of the IC.

As shown in FIG. 6A, FIG. 6B, and FIG. 6C, choosing between split n-wells and a merged n-well has significant implications for semiconductor structures. For example, when a merged n-well (FIG. 6A) is separated into multiple split n-wells (FIG. 6B or FIG. 6C), the type-1 cells (FIG. 6A) may transition to type-2 cell (FIG. 6B) or type-3 cell (FIG. 6C) that occupy a larger horizontal footprint area than the type-1 cell (FIG. 6A). Additionally, the type-2 cell (FIG. 6B) and type-3 cell (FIG. 6C) may need to be double-height cells (to allow for proper stacking with other types of cells), which further increases the space the cells occupy compared to the type-1 cell, which may be a single-height cell. For some types of cells, such as 0-pin retention flops and GDHS cells, this transition from type-1 cell to either type-2 cell or type-3 cell may result in an estimated increase of 1.5% to 2% in the overall chip level area cell profile (based on the KailuaR2 data).

Example aspects presented herein provide an integrated power management cell (or cell island) of an IC. The layout of the integrated power management cell (or cell island) mitigates horizontal space with vertical stacking and is applicable to GAA transistors. The integrated power management cell (or cell island) includes vertically-stacked (instead of horizontally-stacked) voltage domains. It allows the employment of merged n-wells on GAA transistors without significantly increasing the leakage current, thereby reducing the area occupied by GAA transistors. As a result, the overall size of an IC may be reduced. Additionally, the proposed integrated power management cells are scalable. They facilitate the incorporation of multiple bits of voltage level shifter without congestion and allow flipped signal transfer, thereby providing greater versatility in designing layout architectures.

Figure 7:
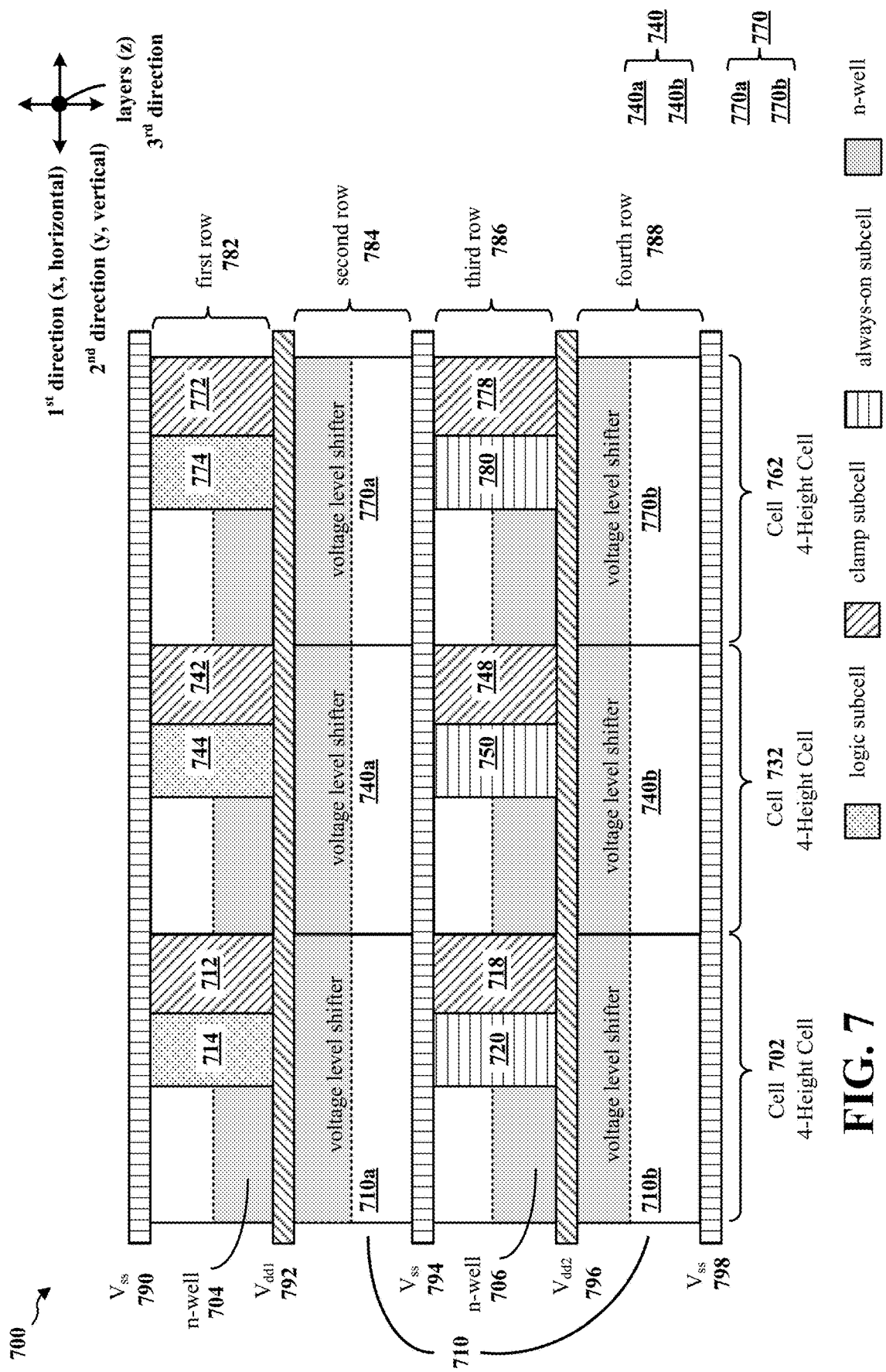
FIG. 7 is a diagram illustrating an example of a set of integrated power management cells in accordance with various aspects of the present disclosure.

FIG. 7 is a diagram 700 illustrating an example of a set of integrated power management cells in accordance with various aspects of the present disclosure. The set of integrated power management cells includes a cell 702. The cell 702 is a 4-height multi-domain cell that includes four rows in the second direction of transistor logic. The cell 702 has a first n-well 704 that is coupled to the power interconnect 792, providing the voltage $V_{dd1}$ associated with a first voltage domain (e.g., 0.435 V-1.155 V). The cell 702 has a second n-well 706 that is coupled to the power interconnect 796, providing the voltage $V_{dd2}$ associated with a second voltage domain (e.g., 2.515 V or 2.565 V). Both n-wells 704, 706 extend in a first direction to edges of the cell 702 (right and left edges in the first direction in FIG. 7) so that the n-wells 704, 706 are continuous with the n-wells of adjacently located cells 732, 762. Accordingly, there is no isolation (e.g., deep trench isolation (DTI), shallow trench isolation (STI)) between the cells 702, 732, 762.

The first row 782 includes transistor logic, including n-type metal oxide semiconductor (MOS) (nMOS) transistors coupled to the power interconnect 790 providing the voltage $V_{ss}$ (e.g., ground voltage), and including p-type MOS (pMOS) transistors coupled to the power interconnect 792 providing the voltage $V_{dd1}$. The second row 784 includes transistor logic, including pMOS transistors coupled to the power interconnect 792 providing the voltage $V_{dd1}$, and including nMOS transistors coupled to the power interconnect 794 providing the voltage $V_{ss}$. The third row 786 includes transistor logic, including nMOS transistors coupled to the power interconnect 794 providing the voltage $V_{ss}$, and including pMOS transistors coupled to the power interconnect 796 providing the voltage $V_{dd2}$. The fourth row 788 includes transistor logic, including pMOS transistors coupled to the power interconnect 796, providing the voltage $V_{dd2}$, and including nMOS transistors coupled to the power interconnect 798, providing the voltage $V_{ss}$.

A voltage level shifter 710 is within rows 784, 788 of the cell 702. The voltage level shifter 710 includes a first subset 710a coupled to the first power domain through the power interconnect 792, providing the voltage $V_{dd1}$, and includes a second subset 710b coupled to the second power domain through the power interconnect 796, providing the voltage $V_{dd2}$. The voltage level shifter 710 is further coupled to the power interconnects 794, 798, providing the voltage $V_{ss}$.

The cell 702 may include a clamp subcell 712 within the first row 782. The clamp subcell 712 is coupled to the first subset 710a of the voltage level shifter 710 and to the power interconnects 790, 792. The cell 702 may further include engineering change order (ECO) subcells 714. The ECO subcells may be replaced with logic cells before fabrication.

The cell 702 may include a clamp subcell 718 within the third row 786. The clamp subcell 718 is coupled to the second subset 710b of the voltage level shifter 710 and to the power interconnects 794, 796. The cell 702 may further include metal programmable always-on subcells 720. The clamp subcell 718 may also be an always-on subcell. FIG. 7 shows one example implementation of the subcells 712, 714, 718, and 720. In some examples, one or more of the subcells 712, 714, 718, and 720 may be metal programmable cells and may be programmed to various types of cells, such as a retention flop, an always-on buffer, or an inverter.

The power interconnects 790, 792, 794, 796, and 798 extend in a first direction across the cell 702 and may be on a lowest metal layer (e.g., $M_0$ or $M_1$ layer) for horizontal interconnects extending in a first direction.

The set of integrated power management cells may further include cell 732 adjacent to the cell 702. The n-well 704 extends in the first direction to edges of the cell 702 and the cell 732 such that the n-well 704 is continuous across the cells 702, 732. The cell 732 is also a 4-height multi-domain cell that includes a voltage level shifter 740 (including subsets 740a, 740b), clamp subcells 742, 748, similar to the clamp subcells 712, 718, respectively, logic cell 744, and a metal programmable always-on subcell 750.

The set of integrated power management cells may further include cell 762 adjacent to the cell 732. The n-well 704 extends in the first direction to edges of the cell 702 and the cell 762 such that the n-well 704 is continuous across the cells 702, 732, 762. The cell 762 is also a 4-height multi-domain cell that includes a voltage level shifter 770 (including subsets 770a, 770b), clamp subcells 772, 778, similar to the clamp subcells 712, 718, respectively, logic subcell 774, and a metal programmable always-on subcell 780.

Figure 8C:
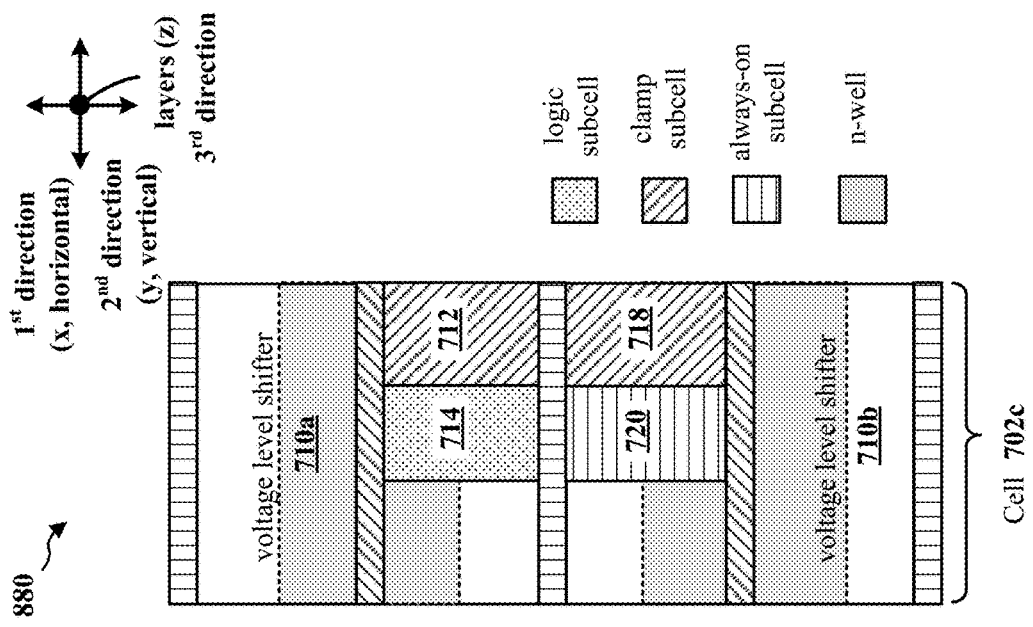
FIG. 8C is a diagram illustrating an example of an integrated power management cell in accordance with various aspects of the present disclosure.
Figure 8B:
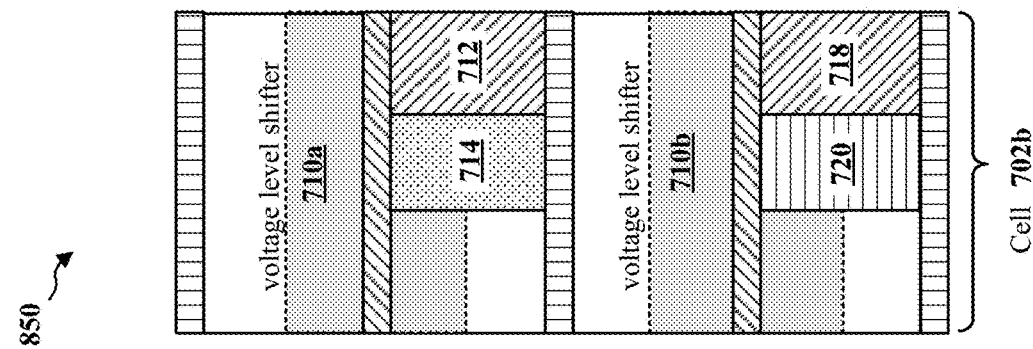
FIG. 8B is a diagram illustrating an example of an integrated power management cell in accordance with various aspects of the present disclosure.
Figure 8A:
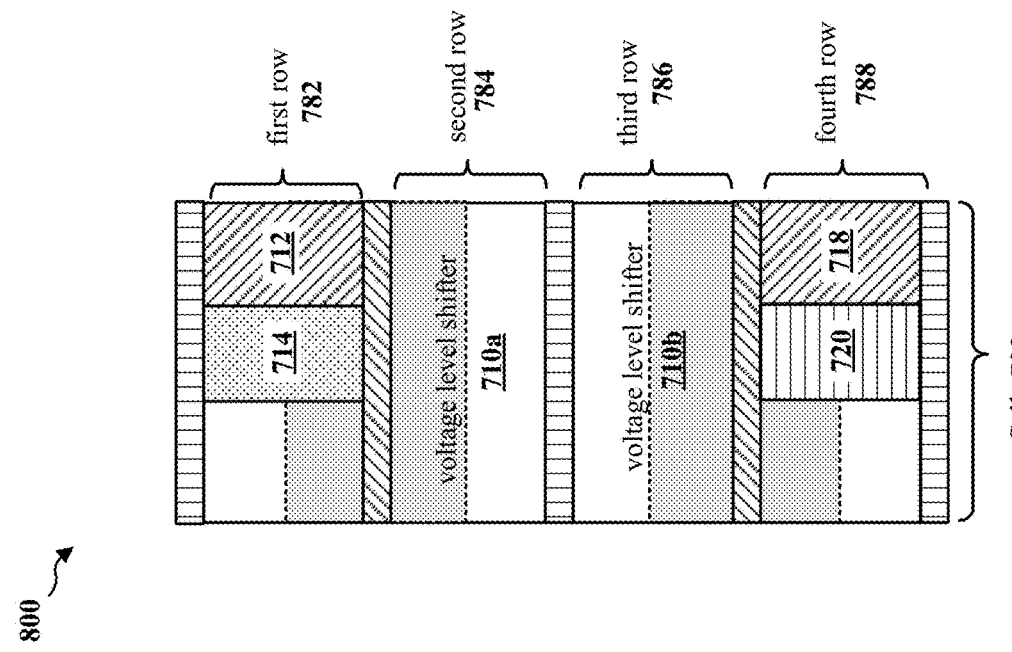
FIG. 8A is a diagram illustrating an example of an integrated power management cell in accordance with various aspects of the present disclosure.

FIG. 8A is a diagram 800 illustrating an example of an integrated power management cell in accordance with various aspects of the present disclosure. FIG. 8B is a diagram 850 illustrating another example of an integrated power management cell in accordance with various aspects of the present disclosure. FIG. 8C is a diagram 880 illustrating another example of an integrated power management cell in accordance with various aspects of the present disclosure. FIG. 7 illustrates the voltage level shifter in the second row 784 and the fourth row 788. Alternatively, the voltage level shifter 710 may be in rows 784, 786, as illustrated in FIG.

8A; in rows 782, 786, as illustrated in FIG. 8B; or in rows 782, 788, as illustrated in FIG. 8C. As illustrated in FIG. 8A, the clamp subcells 712, 718 are in rows 782, 788, respectively. The logic subcell 714 is in row 782 and the metal programmable always-on subcell 720 is in row 788. As illustrated in FIG. 8B, the clamp subcells 712, 718 are in rows 784, 788, respectively. The logic subcell 714 is in row 784 and the metal programmable always-on subcell 720 is in row 788. As illustrated in FIG. 8C, the clamp subcells 712, 718 are in rows 784, 786, respectively. The logic subcell 714 is in row 784 and the metal programmable always-on subcell 720 is in row 786.

Referring again to FIGS. 7, 8A-8C, at least one integrated power management cell of an IC includes a first cell 702. The first cell 702 is a 4-height cell. The first cell 702 includes a first row 782, a second row 784, a third row 786, and a fourth row 788. The first cell 702 includes a first continuous n-well 704 extending in a first direction across portions of the first row 782 and the second row 784 of the first cell 702 to edges of the first cell 702. The first cell 702 further includes a first power interconnect 792 extending in the first direction along the edges of both the first row 782 and the second row 784 of the first cell 702. The first power interconnect 792 is coupled to a first voltage source $V_{dd1}$ associated with a first voltage domain, and is coupled to the first continuous n-well 704. The first cell further includes a second continuous n-well 706 extending in a first direction across portions of the third row 786 and the fourth row 788 of the first cell 702 to edges of the first cell 702. The first cell 702 further includes a second power interconnect 796 extending in the first direction along the edges of both the third row 786 and the fourth row 788 of the first cell 702. The second power interconnect 796 is coupled to a second voltage source $V_{dd2}$ associated with a second voltage domain and to the second continuous n-well 706. The first cell 702 further includes a first subset 710a of a first voltage level shifter 710 in one of the first row 782 (FIGS. 8B, 8C) or the second row 784 (FIGS. 7, 8A) of the first cell 702. The first subset 710a of the first voltage level shifter 710 is associated with the first voltage domain and is coupled to the first power interconnect 792. The first cell 702 further includes a second subset 710b of the first voltage level shifter 710 in one of the third row 786 (FIGS. 8A, 8B) or the fourth row 788 (FIGS. 7, 8C) of the first cell 702. The second subset 710b of the first voltage level shifter 710 is associated with the second voltage domain and is coupled to the second power interconnect 796.

In some aspects, the first cell 702 further includes a first clamp subcell 712 associated with the first voltage domain in one of the first row 782 (FIGS. 7 and 8A) or the second row 784 (FIGS. 8B and 8C) of the first cell 702. The first clamp subcell 712 is coupled to the first power interconnect 792, and the first subset 710a of the first voltage level shifter 710 is in another one of the first row 782 or the second row 784 of the first cell 702. The first cell 702 further includes a second clamp subcell 718 associated with the second voltage domain in one of the third row 786 (FIGS. 7 and 8C) or the fourth row 788 (FIGS. 8A and 8B) of the first cell 702. The second clamp subcell 718 is coupled to the second power interconnect 796, and the second subset 710b of the first voltage level shifter 710 is in another one of the third row 786 or the fourth row 788 of the first cell 702.

In some aspects, the first voltage source $V_{dd1}$ is an input voltage drain to drain (VDD) voltage source, and the second voltage source $V_{dd2}$ is an output VDD voltage source.

In some aspects, the first cell 702 further includes a third power interconnect 790, a fourth power interconnect 794, and a fifth power interconnect 798. The third power interconnect 790 extends in the first direction along an edge of the first row 782 of the first cell 702, and the third power interconnect 790 is coupled to a third voltage source $V_{ss}$. The fourth power interconnect 794 extends in the first direction along the edges of both the second row 784 and the third row 786 of the first cell 702, and the fourth power interconnect 794 is coupled to the third voltage source $V_{ss}$. The fifth power interconnect 798 extends in the first direction along an edge of the fourth row 788 of the first cell 702, and the fifth power interconnect 798 is coupled to the third voltage source $V_{ss}$. The first clamp subcell 712 is coupled to one of the third power interconnect 790 (FIGS. 7 and 8A) or the fourth power interconnect 794 (FIGS. 8B and 8C), and the first subset 710a of the first voltage level shifter 710 is coupled to another one of the third power interconnect 790 or the fourth power interconnect 794. The second clamp subcell 718 is coupled to one of the fourth power interconnect 794 (FIGS. 7 and 8C) or the fifth power interconnect 798 (FIGS. 8A and 8B), and the second subset 710b of the first voltage level shifter 710 is coupled to another one of the fourth power interconnect 794 or the fifth power interconnect 798.

In some aspects, the third voltage source $V_{ss}$ is a voltage source supply (VSS) voltage source.

In some aspects, the first cell 702 further includes a logic subcell 714 associated with the first voltage domain and adjacent the first clamp subcell 712 in one of the first row 782 (FIGS. 7 and 8A) or the second row 784 (FIGS. 8B and 8C) of the first cell 702. The logic subcell 714 is coupled to the first power interconnect 792 and one of the third power interconnect 790 (FIGS. 7 and 8A) or the fourth power interconnect 794 (FIGS. 8B and 8C).

In some aspects, the second clamp subcell 718 is an always-on subcell.

In some aspects, the first cell 702 further includes an always-on subcell 720 associated with the second voltage domain and adjacent the second clamp subcell 718 in one of the third row 786 (FIGS. 7 and 8C) or the fourth row 788 (FIGS. 8A and 8B) of the first cell 702. The always-on subcell 720 is coupled to the second power interconnect 796 and one of the fourth power interconnect 794 (FIGS. 7 and 8C) or the fifth power interconnect 798 (FIGS. 8A and 8B).

In some aspects, as shown in FIG. 7, the first clamp subcell 712 is in the first row 782 of the first cell 702, and the first clamp subcell 712 is coupled to the third power interconnect 790. The first subset 710a of the first voltage level shifter 710 is in the second row 784 of the first cell 702, and the first subset 710a of the first voltage level shifter 710 is coupled to the fourth power interconnect 794. The second clamp subcell 718 is in the third row 786 of the first cell 702, and the second clamp subcell 718 is coupled to the fourth power interconnect 794. The second subset 710b of the first voltage level shifter 710 is in the fourth row 788 of the first cell 702, and the second subset 710b of the first voltage level shifter 710 is coupled to the fifth power interconnect 798.

In some aspects, as shown in FIG. 7, the first cell 702 further includes a logic subcell 714 and an always-on subcell 720. The logic subcell 714 associated with the first voltage domain and adjacent the first clamp subcell 712 in the first row 782 of the first cell 702, and the logic subcell 714 is coupled to the first power interconnect 792 and the third power interconnect 790. The always-on subcell 720 is associated with the second voltage domain and adjacent the second clamp subcell 718 in the third row 786 of the first cell 702, and the always-on subcell 720 is coupled to the second power interconnect 796 and the fourth power interconnect 794.

In some aspects, as shown in FIG. 8C, the first subset 710a of the first voltage level shifter 710 is in the first row 782 of the first cell 702c, and the first subset 710a of the first voltage level shifter 710 is coupled to the third power interconnect 790. The first clamp subcell 712 is in the second row 784 of the first cell 702c, and the first clamp subcell 712 is coupled to the fourth power interconnect 794. The second clamp subcell 718 is in the third row 786 of the first cell 702c, and the second clamp subcell 718 is coupled to the fourth power interconnect 794. The second subset 710b of the first voltage level shifter 710 is in the fourth row 788 of the first cell 702c, and the second subset 710b of the first voltage level shifter 710 is coupled to the fifth power interconnect 798.

In some aspects, as shown in FIG. 8C, the first cell 702c further includes a logic subcell 714 and an always-on subcell 720. The logic subcell 714 is associated with the first voltage domain and adjacent the first clamp subcell 712 in the second row 784 of the first cell 702c. The logic subcell 714 is coupled to the first power interconnect 792 and the fourth power interconnect 794. The always-on subcell 720 is associated with the second voltage domain and adjacent the second clamp subcell 718 in the third row 786 of the first cell 702c. The always-on subcell 720 is coupled to the second power interconnect 796 and the fourth power interconnect 794.

In some aspects, as shown in FIG. 8A, the first clamp subcell 712 is in the first row 782 of the first cell 702a, and the first clamp subcell 712 is coupled to the third power interconnect 790. The first subset 710a of the first voltage level shifter 710 is in the second row 784 of the first cell 702a, and the first subset 710a of the first voltage level shifter 710 is coupled to the fourth power interconnect 794. The second subset 710b of the first voltage level shifter 710 is in the third row 786 of the first cell 702a, and the second subset 710b of the first voltage level shifter 710 is coupled to the fourth power interconnect 794. The second clamp subcell 718 is in the fourth row 788 of the first cell 702a, and the second clamp subcell 718 is coupled to the fifth power interconnect 798.

In some aspects, as shown in FIG. 8A, the first cell 702a further includes a logic subcell 714 and an always-on subcell 720. The logic subcell 714 is associated with the first voltage domain and adjacent the first clamp subcell 712 in the first row 782 of the first cell 702a. The logic subcell 714 is coupled to the first power interconnect 792 and the third power interconnect 790. The always-on subcell 720 is associated with the second voltage domain and adjacent the second clamp subcell 718 in the fourth row 788 of the first cell 702a. The always-on subcell 720 is coupled to the second power interconnect 796 and the fifth power interconnect 798.

In some aspects, as shown in FIG. 8B, the first subset 710a of the first voltage level shifter 710 is in the first row 782 of the first cell 702b. The first subset 710a of the first voltage level shifter 710 is coupled to the third power interconnect 790. The first clamp subcell 712 is in the second row 784 of the first cell 702b, and the first clamp subcell 712 is coupled to the fourth power interconnect 794. The second subset 710b of the first voltage level shifter 710 is in the third row 786 of the first cell 702b, and the second subset 710b of the first voltage level shifter 710 is coupled to the fourth power interconnect 794. The second clamp subcell 718 is in the fourth row 788 of the first cell 702b, and the second clamp subcell 718 is coupled to the fifth power interconnect 798.

In some aspects, as shown in FIG. 8B, the first cell 702b further includes a logic subcell 714 and an always-on subcell 720. The logic subcell 714 is associated with the first voltage domain and adjacent the first clamp subcell 712 in the second row 784 of the first cell 702b. The logic subcell 714 is coupled to the first power interconnect 792 and the fourth power interconnect 794. The always-on subcell 720 is associated with the second voltage domain and adjacent the second clamp subcell 718 in the fourth row 788 of the first cell 702b. The always-on subcell 720 is coupled to the second power interconnect 796 and the fifth power interconnect 798.

In some aspects, as shown in FIG. 7, the at least one integrated power management cell of the IC further includes a second cell 732 adjacent the first cell 702. The second cell 732 is a 4-height cell, and the second cell 732 includes the first row 782, the second row 784, the third row 786, and the fourth row 788. The first continuous n-well 704 extends in the first direction across portions of the first row 782 and the second row 784 of the first cell 702 and the second cell 732 between an edge of the first cell 702 and an edge of the second cell 732. The first power interconnect 792 extends in the first direction along the edges of both the first row 782 and the second row 784 of the first and second cells (702 and 732). The second continuous n-well 706 extends in the first direction across portions of the third row 786 and the fourth row 788 of the first and second cells (702 and 732) between the edge of the first cell 702 and the edge of the second cell 732. The second power interconnect 796 extends in the first direction along the edges of both the third row 786 and the fourth row 788 of the first and second cells (702 and 732).

In some aspects, as shown in FIG. 7, the second cell 732 further includes a first subset 740a of a second voltage level shifter 740 and a second subset 740b of the second voltage level shifter 740. The first subset 740a of the second voltage level shifter 740 is in one of the first row 782 or the second row 784 of the second cell 732. The first subset 740a of the second voltage level shifter 740 is associated with the first voltage domain and coupled to the first power interconnect 792. The second subset 740b of the second voltage level shifter 740 is in one of the third row 786 or the fourth row 788 of the second cell 732. The second subset 740b of the second voltage level shifter 740 is associated with the second voltage domain and being coupled to the second power interconnect 796.

In some aspects, as shown in FIG. 7, the at least one integrated power management cell of the IC further includes a plurality of cells (732 and 762) adjacent the first cell 702. The plurality of cells (732 and 762) each is a 4-height cell, and the plurality of cells (732 and 762) includes the first row 782, the second row 784, the third row 786, and the fourth row 788. The first cell 702 and the plurality of cells (732 and 762) are a set of cells. The first continuous n-well 704 extends in the first direction across portions of the first row 782 and the second row 784 of the set of cells (702, 732, and 762) between edges of the set of cells (702, 732, and 762). The first power interconnect 792 extends in the first direction along the edges of both the first row 782 and the second row 784 of the set of cells (702, 732, and 762). The second continuous n-well 706 extends in the first direction across portions of the third row 786 and the fourth row 788 of the set of cells (702, 732, and 762) between edges of the set of cells (702, 732, and 762). The second power interconnect 796 extends in the first direction along the edges of both the third row 786 and the fourth row 788 of the set of cells (702, 732, and 762). Each cell of the plurality of cells (732 and 762) includes a voltage level shifter (e.g., voltage level shifters 740, 770).

Figure 9:
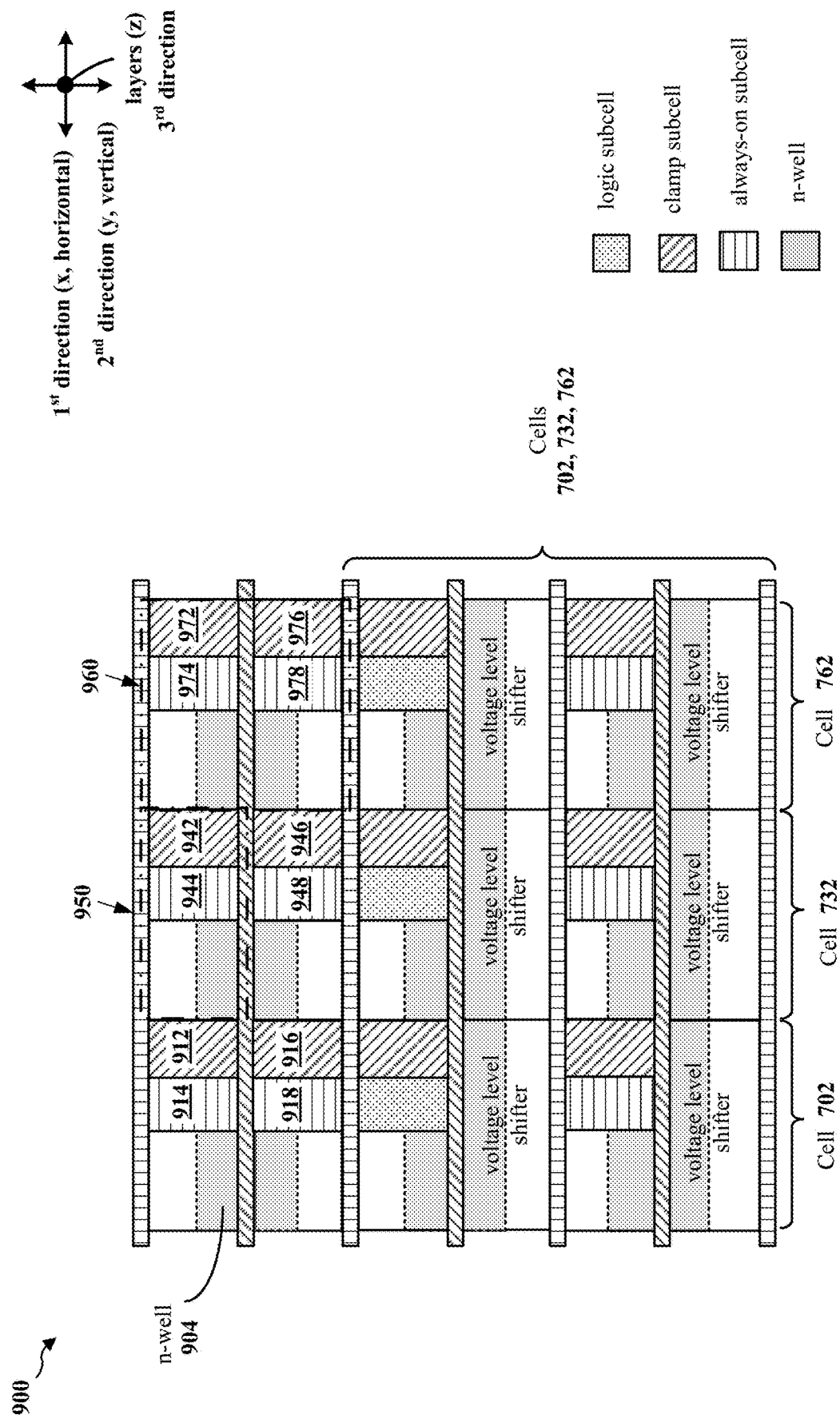
FIG. 9 is a diagram illustrating an example of a set of integrated power management cells and additional cells in accordance with various aspects of the present disclosure.

FIG. 9 is a diagram 900 illustrating an IC including a set of integrated power management cells and additional cells in accordance with various aspects of the present disclosure. As illustrated in FIG. 9, the set of integrated power management sets may be located adjacent in the second direction to additional logic cells that have a continuous n-well 904 coupled to an always-on power domain. The additional logic cells may be single height, such as 950, or double height, such as 960. The additional logic cells may include clamp subcells 912, 916, 942, 946, 972, and 976, and additional logic subcells 914, 918, 944, 948, 974, and 978. Accordingly, the 4-height multi-domain integrated power management cells may be adjacent single-domain single-height or double-height logic cells, or multi-domain logic cells, and the additional logic cells do not lead in a significant increase in the horizontal space.

Figure 10:
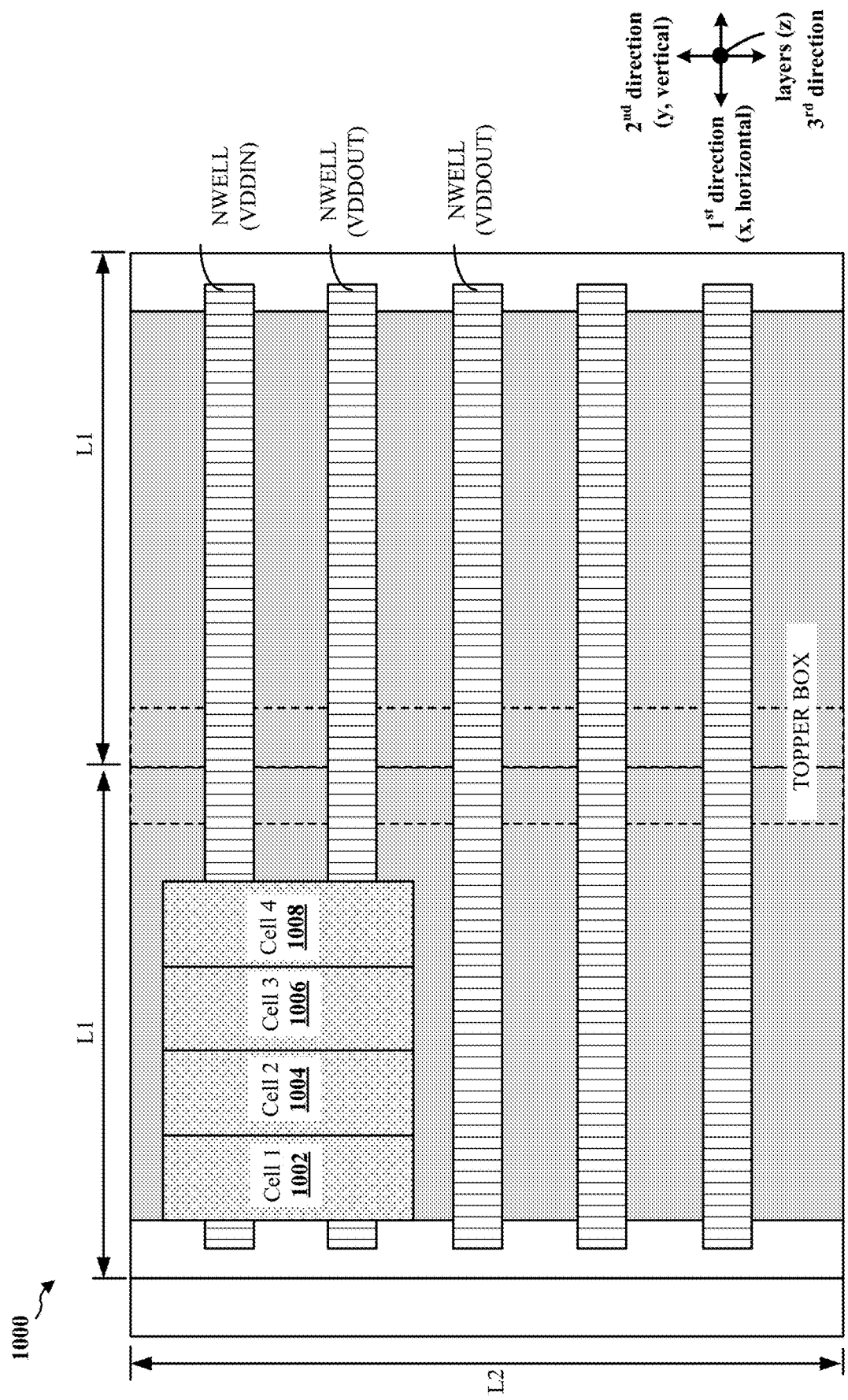
FIG. 10 is a diagram illustrating an example of a set of integrated power management cells in accordance with various aspects of the present disclosure.

In some aspects, the design of the integrated power management cell is scalable, and multiple cells may be lined up along the first direction (e.g., x direction). FIG. 10 is a diagram 1000 illustrating an example a set of integrated power management cells in accordance with various aspects of the present disclosure. In FIG. 10, multiple integrated power management cells, such as cell 1 1002, cell 2 1004, cell 3 1006, and cell 4 1008 may be adjacent to each other along the first direction (e.g., x direction). Each of the cells (cell 1 1002, cell 2 1004, cell 3 1006, and cell 4 1008) may be one of the integrated power management cells of the present disclosure (e.g., cells 702, 702a, 702b, 702c, 732, 762) and may include a voltage level shifter (e.g., voltage level shifter 710, 740, or 770). Thus, this design may provide multiple bits of voltage level shifter without congestion.

In some aspects, the integrated power management cell of the present disclosure (e.g., cells 702, 702a, 702b, 702c, 732, 762) may be flipped (or inverted) vertically to suit various voltage domain signal transfer methods. FIG. 11A is a diagram 1100 illustrating an example of an integrated power management cell 1112 in accordance with various aspects of the present disclosure. FIG. 11B is a diagram 1150 illustrating another example of an integrated power management cell 1162 in accordance with various aspects of the present disclosure. The cell 1112 may be a vertically-flipped version of the cell 1162. FIG. 11A shows an integrated power management cell 1112, where the signals enter from the VDDCX side 1102 and exit via the VDDMX side 1104. In another configuration, FIG. 11B shows another variant of the cell 1162, which allows the signals to enter from the VDDMX side 1152 and exit via the VDDCX side 1154

The aforementioned cell design allows the employment of merged n-wells without significantly increasing the leakage current, thereby reducing the area occupied by a GAA transistor. As a result, the overall size of an IC may be reduced. Additionally, the proposed integrated power management cells are scalable. They facilitate the incorporation of multiple bits of voltage level shifter without congestion and allow flipped signal transfer, thereby providing greater versatility in designing layout architectures.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein the reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B. A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The following examples are illustrative only and may be combined with aspects of other implementations or teachings described herein, without limitation.

Aspect 1 is at least one integrated power management cell of an integrated circuit (IC), comprising a first cell, the first cell being a 4-height cell, the first cell including a first row, a second row, a third row, and a fourth row. The first cell includes a first continuous n-type well (n-well) extending in a first direction across portions of the first row and the second row of the first cell to edges of the first cell; a first power interconnect extending in the first direction along edges of both the first row and the second row of the first cell, the first power interconnect being coupled to a first voltage source associated with a first voltage domain and to the first continuous n-well; a second continuous n-well extending in the first direction across portions of the third row and the fourth row of the first cell to edges of the first cell; a second power interconnect extending in the first direction along edges of both the third row and the fourth row of the first cell, the second power interconnect being coupled to a second voltage source associated with a second voltage domain and to the second continuous n-well; a first subset of a first voltage level shifter in one of the first row or the second row of the first cell, the first subset of the first voltage level shifter being associated with the first voltage domain and coupled to the first power interconnect; and a second subset of the first voltage level shifter in one of the third row or the fourth row of the first cell, the second subset of the first voltage level shifter being associated with the second voltage domain and being coupled to the second power interconnect.

Aspect 2 is the at least one integrated power management cell of the IC of aspect 1, where the first cell further comprises a first clamp subcell associated with the first voltage domain in one of the first row or the second row of the first cell, the first clamp subcell being coupled to the first power interconnect, wherein the first subset of the first voltage level shifter is in an other one of the first row or the second row of the first cell; and a second clamp subcell associated with the second voltage domain in one of the third row or the fourth row of the first cell, the second clamp subcell being coupled to the second power interconnect, wherein the second subset of the first voltage level shifter is in an other one of the third row or the fourth row of the first cell.

Aspect 3 is the at least one integrated power management cell of the IC of any of aspects 1 and 2, wherein the first voltage source is an input voltage drain to drain (VDD) voltage source, and the second voltage source is an output VDD voltage source.

Aspect 4 is the at least one integrated power management cell of the IC of any of aspects 1 to 2, wherein the first cell further comprises: a third power interconnect extending in the first direction along an edge of the first row of the first cell, the third power interconnect being coupled to a third voltage source; a fourth power interconnect extending in the first direction along edges of both the second row and the third row of the first cell, the fourth power interconnect being coupled to the third voltage source; and a fifth power interconnect extending in the first direction along an edge of the fourth row of the first cell, the fifth power interconnect being coupled to the third voltage source, wherein the first clamp subcell is coupled to one of the third power interconnect or the fourth power interconnect, and the first subset of the first voltage level shifter is coupled to an other one of the third power interconnect or the fourth power interconnect, and wherein the second clamp subcell is coupled to one of the fourth power interconnect or the fifth power interconnect, and the second subset of the first voltage level shifter is coupled to an other one of the fourth power interconnect or the fifth power interconnect.

Aspect 5 is the at least one integrated power management cell of the IC of aspect 4, wherein the third voltage source is a voltage source supply (VSS) voltage source.

Aspect 6 is the at least one integrated power management cell of the IC of aspect 4, wherein the first cell further comprises a logic subcell associated with the first voltage domain, the logic subcell being adjacent the first clamp subcell in one of the first row or the second row of the first cell, the logic subcell being coupled to the first power interconnect and one of the third power interconnect or the fourth power interconnect.

Aspect 7 is the at least one integrated power management cell of the IC of aspect 4, wherein the second clamp subcell is an always-on subcell.

Aspect 8 is the at least one integrated power management cell of the IC of aspect 4, wherein the first cell further comprises an always-on subcell associated with the second voltage domain, the always-on subcell being adjacent the second clamp subcell in one of the third row or the fourth row of the first cell, the always-on subcell being coupled to the second power interconnect and one of the fourth power interconnect or the fifth power interconnect.

Aspect 9 is the at least one integrated power management cell of the IC of aspect 4, wherein the first clamp subcell is in the first row of the first cell, the first clamp subcell being coupled to the third power interconnect; the first subset of the first voltage level shifter is in the second row of the first cell, the first subset of the first voltage level shifter being coupled to the fourth power interconnect; the second clamp subcell is in the third row of the first cell, the second clamp subcell being coupled to the fourth power interconnect; and the second subset of the first voltage level shifter is in the fourth row of the first cell, the second subset of the first voltage level shifter being coupled to the fifth power interconnect.

Aspect 10 is the at least one integrated power management cell of the IC of aspect 9, wherein the first cell further comprises a logic subcell associated with the first voltage domain, the logic subcell being adjacent the first clamp subcell in the first row of the first cell, the logic subcell being coupled to the first power interconnect and the third power interconnect; and an always-on subcell associated with the second voltage domain, the always-on subcell being adjacent the second clamp subcell in the third row of the first cell, the always-on subcell being coupled to the second power interconnect and the fourth power interconnect.

Aspect 11 is the at least one integrated power management cell of the IC of aspect 4, wherein the first subset of the first voltage level shifter is in the first row of the first cell, the first subset of the first voltage level shifter being coupled to the third power interconnect; the first clamp subcell is in the second row of the first cell, the first clamp subcell being coupled to the fourth power interconnect; the second clamp subcell is in the third row of the first cell, the second clamp subcell being coupled to the fourth power interconnect; and the second subset of the first voltage level shifter is in the fourth row of the first cell, the second subset of the first voltage level shifter being coupled to the fifth power interconnect.

Aspect 12 is the at least one integrated power management cell of the IC of aspect 12, wherein the first cell further comprises a logic subcell associated with the first voltage domain, the logic subcell being adjacent the first clamp subcell in the second row of the first cell, the logic subcell being coupled to the first power interconnect and the fourth power interconnect; and an always-on subcell associated with the second voltage domain, the always-on subcell being adjacent the second clamp subcell in the third row of the first cell, the always-on subcell being coupled to the second power interconnect and the fourth power interconnect.

Aspect 13 is the at least one integrated power management cell of the IC of aspect 4, wherein the first clamp subcell is in the first row of the first cell, the first clamp subcell being coupled to the third power interconnect; the first subset of the first voltage level shifter is in the second row of the first cell, the first subset of the first voltage level shifter being coupled to the fourth power interconnect; the second subset of the first voltage level shifter is in the third row of the first cell, the second subset of the first voltage level shifter being coupled to the fourth power interconnect; and the second clamp subcell is in the fourth row of the first cell, the second clamp subcell being coupled to the fifth power interconnect.

Aspect 14 is the at least one integrated power management cell of the IC of aspect 13, wherein the first cell further comprises a logic subcell associated with the first voltage domain, the logic subcell being adjacent the first clamp subcell in the first row of the first cell, the logic subcell being coupled to the first power interconnect and the third power interconnect; and an always-on subcell associated with the second voltage domain, the always-on subcell being adjacent the second clamp subcell in the fourth row of the first cell, the always-on subcell being coupled to the second power interconnect and the fifth power interconnect.

Aspect 15 is the at least one integrated power management cell of the IC of aspect 4, wherein the first subset of the first voltage level shifter is in the first row of the first cell, the first subset of the first voltage level shifter being coupled to the third power interconnect; the first clamp subcell is in the second row of the first cell, the first clamp subcell being coupled to the fourth power interconnect; the second subset of the first voltage level shifter is in the third row of the first cell, the second subset of the first voltage level shifter being coupled to the fourth power interconnect; and the second clamp subcell is in the fourth row of the first cell, the second clamp subcell being coupled to the fifth power interconnect.

Aspect 16 is the at least one integrated power management cell of aspect 15, wherein the first cell further comprises a logic subcell associated with the first voltage domain, the logic subcell being adjacent the first clamp subcell in the second row of the first cell, the logic subcell being coupled to the first power interconnect and the fourth power interconnect; and an always-on subcell associated with the second voltage domain, the always-on subcell being adjacent the second clamp subcell in the fourth row of the first cell, the always-on subcell being coupled to the second power interconnect and the fifth power interconnect.

Aspect 17 is the at least one integrated power management cell of the IC of any of aspects 1 to 16, where the at least one integrated power management cell of the IC further comprises a second cell adjacent the first cell, the second cell being a 4-height cell, the second cell including the first row, the second row, the third row, and the fourth row, wherein the first continuous n-well extends in the first direction across portions of the first row and the second row of the first and second cells between an edge of the first cell and an edge of the second cell; the first power interconnect extends in the first direction along edges of both the first row and the second row of the first and second cells; the second continuous n-well extends in the first direction across portions of the third row and the fourth row of the first and second cells between the edge of the first cell and the edge of the second cell; the second power interconnect extends in the first direction along edges of both the third row and the fourth row of the first and second cells.

Aspect 18 is the at least one integrated power management cell of the IC of aspect 17, wherein the second cell further comprises a first subset of a second voltage level shifter in one of the first row or the second row of the second cell, the first subset of the second voltage level shifter being associated with the first voltage domain and coupled to the first power interconnect; and a second subset of the second voltage level shifter in one of the third row or the fourth row of the second cell, the second subset of the second voltage level shifter being associated with the second voltage domain and being coupled to the second power interconnect.

Aspect 19 is the at least one integrated power management cell of the IC of any of aspects 1 to 16, where the at least one integrated power management cell of the IC further comprises a plurality of cells adjacent the first cell, the plurality of cells each being a 4-height cell, the plurality of cells including the first row, the second row, the third row, and the fourth row, the first cell and the plurality of cells being a set of cells, wherein the first continuous n-well extends in the first direction across portions of the first row and the second row of the set of cells between edges of the set of cells; the first power interconnect extends in the first direction along edges of both the first row and the second row of the set of cells; the second continuous n-well extends in the first direction across portions of the third row and the fourth row of the set of cells between edges of the set of cells; the second power interconnect extends in the first direction along edges of both the third row and the fourth row of the set of cells; wherein each cell of the plurality of cells includes a voltage level shifter.

What is claimed is:

1. At least one integrated power management cell of an integrated circuit (IC), comprising:
   a first cell, the first cell being a 4-height cell, the first cell including a first row, a second row, a third row, and a fourth row,
   the first cell comprising:
   a first continuous n-type well (n-well) extending in a first direction across portions of the first row and the second row of the first cell to edges of the first cell;
   a first power interconnect extending in the first direction along edges of both the first row and the second row of the first cell, the first power interconnect being coupled to a first voltage source associated with a first voltage domain and to the first continuous n-well;
   a second continuous n-well extending in the first direction across portions of the third row and the fourth row of the first cell to edges of the first cell;
   a second power interconnect extending in the first direction along edges of both the third row and the fourth row of the first cell, the second power interconnect being coupled to a second voltage source associated with a second voltage domain and to the second continuous n-well;
   a first subset of a first voltage level shifter in one of the first row or the second row of the first cell, the first subset of the first voltage level shifter being associated with the first voltage domain and coupled to the first power interconnect; and
   a second subset of the first voltage level shifter in one of the third row or the fourth row of the first cell, the second subset of the first voltage level shifter being associated with the second voltage domain and being coupled to the second power interconnect.

2. The at least one integrated power management cell of the IC of claim 1, wherein the first cell further comprises:
   a first clamp subcell associated with the first voltage domain in one of the first row or the second row of the first cell, the first clamp subcell being coupled to the first power interconnect, wherein the first subset of the first voltage level shifter is in an other one of the first row or the second row of the first cell; and a second clamp subcell associated with the second voltage domain in one of the third row or the fourth row of the first cell, the second clamp subcell being coupled to the second power interconnect, wherein the second subset of the first voltage level shifter is in an other one of the third row or the fourth row of the first cell.

3. The at least one integrated power management cell of the IC of claim 1, wherein the first voltage source is an input voltage drain to drain (VDD) voltage source, and the second voltage source is an output VDD voltage source.

4. The at least one integrated power management cell of the IC of claim 2, wherein the first cell further comprises:
a third power interconnect extending in the first direction along an edge of the first row of the first cell, the third power interconnect being coupled to a third voltage source;
a fourth power interconnect extending in the first direction along edges of both the second row and the third row of the first cell, the fourth power interconnect being coupled to the third voltage source; and
a fifth power interconnect extending in the first direction along an edge of the fourth row of the first cell, the fifth power interconnect being coupled to the third voltage source,
wherein the first clamp subcell is coupled to one of the third power interconnect or the fourth power interconnect, and the first subset of the first voltage level shifter is coupled to an other one of the third power interconnect or the fourth power interconnect, and
wherein the second clamp subcell is coupled to one of the fourth power interconnect or the fifth power interconnect, and the second subset of the first voltage level shifter is coupled to an other one of the fourth power interconnect or the fifth power interconnect.

5. The at least one integrated power management cell of the IC of claim 4, wherein the third voltage source is a voltage source supply (VSS) voltage source.

6. The at least one integrated power management cell of the IC of claim 4, wherein the first cell further comprises:
a logic subcell associated with the first voltage domain, the logic subcell being adjacent the first clamp subcell in one of the first row or the second row of the first cell, the logic subcell being coupled to the first power interconnect and one of the third power interconnect or the fourth power interconnect.

7. The at least one integrated power management cell of the IC of claim 4, wherein the second clamp subcell is an always-on subcell.

8. The at least one integrated power management cell of the IC of claim 4, wherein the first cell further comprises:
an always-on subcell associated with the second voltage domain, the always-on subcell being adjacent the second clamp subcell in one of the third row or the fourth row of the first cell, the always-on subcell being coupled to the second power interconnect and one of the fourth power interconnect or the fifth power interconnect.

9. The at least one integrated power management cell of the IC of claim 4, wherein:
the first clamp subcell is in the first row of the first cell, the first clamp subcell being coupled to the third power interconnect;

the first subset of the first voltage level shifter is in the second row of the first cell, the first subset of the first voltage level shifter being coupled to the fourth power interconnect;
the second clamp subcell is in the third row of the first cell, the second clamp subcell being coupled to the fourth power interconnect; and
the second subset of the first voltage level shifter is in the fourth row of the first cell, the second subset of the first voltage level shifter being coupled to the fifth power interconnect.

10. The at least one integrated power management cell of the IC of claim 9, wherein the first cell further comprises:
a logic subcell associated with the first voltage domain, the logic subcell being adjacent the first clamp subcell in the first row of the first cell, the logic subcell being coupled to the first power interconnect and the third power interconnect; and
an always-on subcell associated with the second voltage domain, the always-on subcell being adjacent the second clamp subcell in the third row of the first cell, the always-on subcell being coupled to the second power interconnect and the fourth power interconnect.

11. The at least one integrated power management cell of the IC of claim 4, wherein:
the first subset of the first voltage level shifter is in the first row of the first cell, the first subset of the first voltage level shifter being coupled to the third power interconnect;
the first clamp subcell is in the second row of the first cell, the first clamp subcell being coupled to the fourth power interconnect;
the second clamp subcell is in the third row of the first cell, the second clamp subcell being coupled to the fourth power interconnect; and
the second subset of the first voltage level shifter is in the fourth row of the first cell, the second subset of the first voltage level shifter being coupled to the fifth power interconnect.

12. The at least one integrated power management cell of the IC of claim 11, wherein the first cell further comprises:
a logic subcell associated with the first voltage domain, the logic subcell being adjacent the first clamp subcell in the second row of the first cell, the logic subcell being coupled to the first power interconnect and the fourth power interconnect; and
an always-on subcell associated with the second voltage domain, the always-on subcell being adjacent the second clamp subcell in the third row of the first cell, the always-on subcell being coupled to the second power interconnect and the fourth power interconnect.

13. The at least one integrated power management cell of the IC of claim 4, wherein:
the first clamp subcell is in the first row of the first cell, the first clamp subcell being coupled to the third power interconnect;
the first subset of the first voltage level shifter is in the second row of the first cell, the first subset of the first voltage level shifter being coupled to the fourth power interconnect;
the second subset of the first voltage level shifter is in the third row of the first cell, the second subset of the first voltage level shifter being coupled to the fourth power interconnect; and
the second clamp subcell is in the fourth row of the first cell, the second clamp subcell being coupled to the fifth power interconnect.

14. The at least one integrated power management cell of the IC of claim 13, wherein the first cell further comprises:
- a logic subcell associated with the first voltage domain, the logic subcell being adjacent the first clamp subcell in the first row of the first cell, the logic subcell being coupled to the first power interconnect and the third power interconnect; and
- an always-on subcell associated with the second voltage domain, the always-on subcell being adjacent the second clamp subcell in the fourth row of the first cell, the always-on subcell being coupled to the second power interconnect and the fifth power interconnect.

15. The at least one integrated power management cell of the IC of claim 4, wherein:
- the first subset of the first voltage level shifter is in the first row of the first cell, the first subset of the first voltage level shifter being coupled to the third power interconnect;
- the first clamp subcell is in the second row of the first cell, the first clamp subcell being coupled to the fourth power interconnect;
- the second subset of the first voltage level shifter is in the third row of the first cell, the second subset of the first voltage level shifter being coupled to the fourth power interconnect; and
- the second clamp subcell is in the fourth row of the first cell, the second clamp subcell being coupled to the fifth power interconnect.

16. The at least one integrated power management cell of the IC of claim 15, wherein the first cell further comprises:
- a logic subcell associated with the first voltage domain, the logic subcell being adjacent the first clamp subcell in the second row of the first cell, the logic subcell being coupled to the first power interconnect and the fourth power interconnect; and
- an always-on subcell associated with the second voltage domain, the always-on subcell being adjacent the second clamp subcell in the fourth row of the first cell, the always-on subcell being coupled to the second power interconnect and the fifth power interconnect.

17. The at least one integrated power management cell of the IC of claim 1, further comprising:
- a second cell adjacent the first cell, the second cell being a 4-height cell, the second cell including the first row, the second row, the third row, and the fourth row, wherein:
- the first continuous n-well extends in the first direction across portions of the first row and the second row of the first and second cells between an edge of the first cell and an edge of the second cell;
- the first power interconnect extends in the first direction along edges of both the first row and the second row of the first and second cells;
- the second continuous n-well extends in the first direction across portions of the third row and the fourth row of the first and second cells between the edge of the first cell and the edge of the second cell;
- the second power interconnect extends in the first direction along edges of both the third row and the fourth row of the first and second cells.

18. The at least one integrated power management cell of the IC of claim 17, wherein the second cell further comprises:
- a first subset of a second voltage level shifter in one of the first row or the second row of the second cell, the first subset of the second voltage level shifter being associated with the first voltage domain and coupled to the first power interconnect; and
- a second subset of the second voltage level shifter in one of the third row or the fourth row of the second cell, the second subset of the second voltage level shifter being associated with the second voltage domain and being coupled to the second power interconnect.

19. The at least one integrated power management cell of the IC of claim 1, further comprising:
- a plurality of cells adjacent the first cell, the plurality of cells each being a 4-height cell, the plurality of cells including the first row, the second row, the third row, and the fourth row, the first cell and the plurality of cells being a set of cells, wherein:
- the first continuous n-well extends in the first direction across portions of the first row and the second row of the set of cells between edges of the set of cells;
- the first power interconnect extends in the first direction along edges of both the first row and the second row of the set of cells;
- the second continuous n-well extends in the first direction across portions of the third row and the fourth row of the set of cells between edges of the set of cells;
- the second power interconnect extends in the first direction along edges of both the third row and the fourth row of the set of cells;
- wherein each cell of the plurality of cells includes a voltage level shifter.

* * * * *